United States Patent
Humblet

(10) Patent No.: US 10,425,109 B1
(45) Date of Patent: Sep. 24, 2019

(54) METHOD, APPARATUS, AND SYSTEM FOR DEINTERLEAVING DATA

(71) Applicant: Acacia Communications, Inc., Maynard, MA (US)

(72) Inventor: Pierre Humblet, Cambridge, MA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/109,612

(22) Filed: Aug. 22, 2018

Related U.S. Application Data

(60) Provisional application No. 62/717,770, filed on Aug. 10, 2018.

(51) Int. Cl.
*H04L 27/34* (2006.01)
*H03M 13/27* (2006.01)
*H04L 1/00* (2006.01)

(52) U.S. Cl.
CPC ..... *H03M 13/2785* (2013.01); *H03M 13/276* (2013.01); *H04L 1/0071* (2013.01); *H04L 27/34* (2013.01)

(58) Field of Classification Search
CPC . H03M 13/2785; H03M 13/276; H04L 27/34; H04L 1/0071
See application file for complete search history.

(56) References Cited

U.S. PATENT DOCUMENTS

| | | | |
|---|---|---|---|
| 4,295,218 A | 10/1981 | Tanner | |
| 5,392,299 A * | 2/1995 | Rhines | G11B 20/1866 714/755 |
| 5,535,220 A * | 7/1996 | Kanno | H03M 13/271 370/515 |
| 5,563,897 A | 10/1996 | Pyndiah | |
| 5,659,580 A * | 8/1997 | Partyka | H03M 13/2764 365/189.02 |
| 5,928,371 A * | 7/1999 | Robinson, Jr. | H04L 1/0071 714/702 |
| 6,151,690 A * | 11/2000 | Peeters | H03M 13/2732 711/157 |
| 6,553,517 B1 * | 4/2003 | Prasad | H03M 13/2764 370/474 |
| 7,170,849 B1 * | 1/2007 | Arivoli | H03M 13/2707 370/208 |
| 8,276,047 B2 | 9/2012 | Coe | |
| 8,751,910 B2 | 6/2014 | Farhoodfar | |
| 8,959,418 B1 | 2/2015 | Pfister | |
| 9,112,529 B1 | 8/2015 | Mazahreh | |
| 9,906,360 B2 * | 2/2018 | Johnson | G06F 21/14 |
| 2003/0041293 A1 * | 2/2003 | Zheng | H03M 13/271 714/701 |

(Continued)

FOREIGN PATENT DOCUMENTS

EP    1396954 A1    3/2004

OTHER PUBLICATIONS

Bahl et al., Optimal decoding of linear codes for minimizing symbol error rate, IEEE Trans on Info Theory. Mar. 1974;20:284-287.

(Continued)

*Primary Examiner* — Kenneth T Lam

(74) *Attorney, Agent, or Firm* — Joseph D'Angelo

(57) ABSTRACT

A method, apparatus, and system for deinterleaving data.

20 Claims, 11 Drawing Sheets

(56) References Cited

U.S. PATENT DOCUMENTS

| | | | |
|---|---|---|---|
| 2003/0120995 A1* | 6/2003 | Kim | H03M 13/258 |
| | | | 714/786 |
| 2006/0013342 A1* | 1/2006 | Rhee | H03M 13/2707 |
| | | | 375/340 |
| 2007/0067704 A1* | 3/2007 | Altintas | H03M 13/27 |
| | | | 714/795 |
| 2009/0300300 A1* | 12/2009 | Treigherman | H04L 1/0052 |
| | | | 711/157 |
| 2015/0039962 A1* | 2/2015 | Fonseka | H03M 13/2909 |
| | | | 714/755 |

OTHER PUBLICATIONS

Chase, A class of algorithms for decoding block codes with channel measurement information. IEEE Trans on Info Theory. Jan. 1972;18:I 70-182.

Cola Volpe et al., Extrinsic information in iterative decoding: A unified view. IEEE Trans on Comm. Dec. 2001;49(12):2088-94.

Cuevas et al., New architecture for high data rate turbo decoding of product codes. IEEE Proc of Globecom'02. Nov. 17-21, 2002 ; v2:1363-67.

Feltstrom et al., Braided block codes. IEEE Trans on Info Theory. Jun. 2009;55(6):2640-58.

Jian et al., Iterative hard-decision decoding of braided BCH codes for high-speed optical communication, IEEE Proc of Globecom' 13. Dec. 9-13, 2013;23 7 6-81.

Johansson et al., A simple one-sweep algorithm for optimal APP symbol decoding of linear block codes. IEEE Trans on Info Theory. Nov. 1998;44(7):3124-29.

Pyndiah et al., Near optimum decoding of product codes. Proc IEEE Globecom'94 Conf, Nov.-Dec. 1994;I/3:339-343.

Pyndiah, Near-optimum decoding of product codes: Block turbo codes. IEEE Trans on Comm. Aug. 1998;46(8):1003-10.

Truhachev et al., On braided block codes. Proc IEEE Int Symp Info Theon. Jun. 29-Jul. 4, 2003; 32.

Zigangirov et al., Encoders and decoders for braided block codes. Proc IEEE Int Symp Info Theory. Jul. 9-14, 2006;1808-12.

European Search Report and Annex received for EP Application No. 18213428.8, dated Feb. 20, 2019, 16 pages.

Northcott, P.. "Cyclically Interleaved BCH Swizzle FEC for OTU4 IrDI and Optionally IaDI," PMC-Sierra, Burnaby, BC, Canada, Milpitas Meeting Mar. 16-20, 2009, XP044039pp. 1-8.

Wang, J. et al., "Performance Bounds on Product Codes with Hyper-Diagonal Parity," 2000 Conf. on Inf. Sci. & Sys., Princeton Univ., XP-001034704, Mar. 2000, pp. WP7-1-WP7-6.

Smith, B.P. et al., "Staircase Codes: FEC for 100 Gb/s OTN," IEEE/OSA Journal of Lightwave Technology, DOI 10.1109/JLT. 2011.2175479, Jan. 2012, pp. 1-8.

Feltstrom, A.J. et al., "Braided Block Codes," IEEE Transactions on Information Theory, vol. 55, No. 6, DOI 10.1109/TIT.2009. 2018350, Jun. 2009, pp. 2640-2658.

Tzimpragos, G. et al., "A Survey on FEC Codes for 100G and Beyond Optical Networks," IEEE Communications Surveys & Tutorials, DOI 10.1109/COMST.2014.2361754, 2014, pp. 1-15.

* cited by examiner

| MOD | MEAN | MIN | MAX |
|---|---|---|---|
| QPSK | 64 | 64 | 64 |
| 8 QAM | 42.66 | 37 | 46 |
| 16 QAM | 32 | 32 | 32 |

| SUBSET NUMBER | ROW BLOCKS |
| --- | --- |
| 0 | 0, 2, ..., 40 |
| 1 | 1, 3, ..., 41 |
| 2 | 42, 44, ..., 82 |
| 3 | 43, 45, ..., 83 |

FIG. 6

| | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | 0,0 | 1,1 | 2,2 | 3,3 | 4,4 | 5,5 | 6,6 | 7,7 | 8,8 | 9,9 | 10,10 | 11,11 | 12,12 | 13,13 | 14,14 | 15,15 |
| 1 | 14,15 | 15,0 | 0,1 | 1,2 | 2,3 | 3,4 | 4,5 | 5,6 | 6,7 | 7,8 | 8,9 | 9,10 | 10,11 | 11,12 | 12,13 | 13,14 |
| 2 | 12,14 | 13,15 | 14,0 | 15,1 | 0,2 | 1,3 | 2,4 | 3,5 | 4,6 | 5,7 | 6,8 | 7,9 | 8,10 | 9,11 | 10,12 | 11,13 |
| 3 | 10,13 | 11,14 | 12,15 | 13,0 | 14,1 | 15,2 | 0,3 | 1,4 | 2,5 | 3,6 | 4,7 | 5,8 | 6,9 | 7,10 | 8,11 | 9,12 |
| 4 | 8,12 | 9,13 | 10,14 | 11,15 | 12,0 | 13,1 | 14,2 | 15,3 | 0,4 | 1,5 | 2,6 | 3,7 | 4,8 | 5,9 | 6,10 | 7,11 |
| 5 | 6,11 | 7,12 | 8,13 | 9,14 | 10,15 | 11,0 | 12,1 | 13,2 | 14,3 | 15,4 | 0,5 | 1,6 | 2,7 | 3,8 | 4,9 | 5,10 |
| 6 | 4,10 | 5,11 | 6,12 | 7,13 | 8,14 | 9,15 | 10,0 | 11,1 | 12,2 | 13,3 | 14,4 | 15,5 | 0,6 | 1,7 | 2,8 | 3,9 |
| 7 | 2,9 | 3,10 | 4,11 | 5,12 | 6,13 | 7,14 | 8,15 | 9,0 | 10,1 | 11,2 | 12,3 | 13,4 | 14,5 | 15,6 | 0,7 | 1,8 |
| 8 | 15,7 | 0,8 | 1,9 | 2,10 | 3,11 | 4,12 | 5,13 | 6,14 | 7,15 | 8,0 | 9,1 | 10,2 | 11,3 | 12,4 | 13,5 | 14,6 |
| 9 | 13,6 | 14,7 | 15,8 | 0,9 | 1,10 | 2,11 | 3,12 | 4,13 | 5,14 | 6,15 | 7,0 | 8,1 | 9,2 | 10,3 | 11,4 | 12,5 |
| 10 | 11,5 | 12,6 | 13,7 | 14,8 | 15,9 | 0,10 | 1,11 | 2,12 | 3,13 | 4,14 | 5,15 | 6,0 | 7,1 | 8,2 | 9,3 | 10,4 |
| 11 | 9,4 | 10,5 | 11,6 | 12,7 | 13,8 | 14,9 | 15,10 | 0,11 | 1,12 | 2,13 | 3,14 | 4,15 | 5,0 | 6,1 | 7,2 | 8,3 |
| 12 | 7,3 | 8,4 | 9,5 | 10,6 | 11,7 | 12,8 | 13,9 | 14,10 | 15,11 | 0,12 | 1,13 | 2,14 | 3,15 | 4,0 | 5,1 | 6,2 |
| 13 | 5,2 | 6,3 | 7,4 | 8,5 | 9,6 | 10,7 | 11,8 | 12,9 | 13,10 | 14,11 | 15,12 | 0,13 | 1,14 | 2,15 | 3,0 | 4,1 |
| 14 | 3,1 | 4,2 | 5,3 | 6,4 | 7,5 | 8,6 | 9,7 | 10,8 | 11,9 | 12,10 | 13,11 | 14,12 | 15,13 | 0,14 | 1,15 | 2,0 |
| 15 | 1,0 | 2,1 | 3,2 | 4,3 | 5,4 | 6,5 | 7,6 | 8,7 | 9,8 | 10,9 | 11,10 | 12,11 | 13,12 | 14,13 | 15,14 | 0,15 |

FIG. 8

METHOD, APPARATUS, AND SYSTEM FOR DEINTERLEAVING DATA

RELATED APPLICATIONS

This application claims the benefit of U.S. provisional patent application 62/717,770filed Aug. 10, 2018, titled "Interleaver," which is incorporated by reference in its entirety for all purposes. This application is related to U.S. patent application Ser. No. 15/637,808, filed Jun. 29, 2017, titled "FORWARD ERROR CORRECTION SYSTEMS AND METHODS," which is incorporated by reference in its entirety for all purposes. This application is related to U.S. patent application Ser. No. 16/102,400, filed Aug. 13, 2018, titled "INTERLEAVER," which is incorporated by reference in its entirety for all purposes.

BACKGROUND

A deinterleaver is often used in certain types of communication systems

BRIEF DESCRIPTION OF THE FIGURES

Various aspects and embodiments of the application will be described with reference to the following example embodiments. It should be appreciated that the figures are not necessarily drawn to scale.

FIG. 3 is a simplified illustration of a table showing a mean, minimum, and maximum of occurrences of a bits in each reliability class in a constituent code for modulations of interest, in accordance with an embodiment of the present disclosure;

FIG. 4 is a simplified illustration of a table showing a bit index in an output group for encoded bits in a block for 16 QAM, in accordance with an embodiment of the present disclosure;

FIG. 5 is a simplified illustration of a table showing a bit index in an output group for encoded bits in a block for QPSK, in accordance with an embodiment of the present disclosure;

FIG. 6 is a simplified illustration of portioning a buffer into 4 subsets, in accordance with an embodiment of the present disclosure;

FIG. 8 is an illustration of a table for unmapping intra-block interleaving, in accordance with an embodiment of the present disclosure;

SUMMARY

Figure 1A:
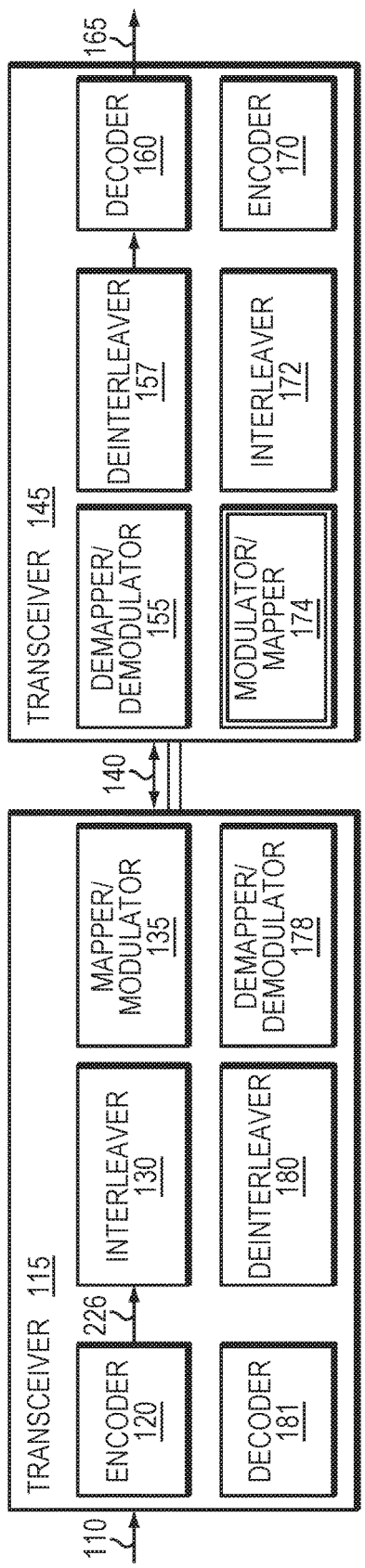
FIG. 1a is a simplified illustration of an optical communication system, in accordance with an embodiment of the present disclosure.

A method, apparatus, and system for a deinterleaver.

DETAILED DESCRIPTION

In some embodiments, a communication system may transmit data from a transmitter to a receiver over a communication link. In many embodiments, a communication link may be exposed to environmental conditions that may interfere with data transmitted over a communication link. In certain embodiments, a way to correct for interference over a communication link may be to use an encoder on a transmission side of a communication link. In most embodiments, a way to correct for interference over a communication link may be to use a decoder on a receiver side of a transmission link. In some embodiments, an error correction code used by an encoder and decoder may be composed of smaller "constituent codes." In most embodiments, an error correction code may add redundant bits to specific information bits that may allow recovery of some or all the information when one or more of the information bits has become corrupted. In different embodiments, the amount of corrupted information that may be recovered may depend on the amount of additional or redundant bits added to information bits. In certain embodiments, a code word may be an element of a particular code. In a particular embodiment, for example, a size 1024×1024 Product Code may be a square array of bits where each row and each column form a constituent code of size 1024. In many embodiments, a way to correct for interference over a communication link may be to use an interleaver on a transmitter side of a transmission link. In many embodiments, a way to correct for interference over a communication link may be to use a deinterleaver on a receiver side of a transmission link.

In many embodiments, an encoder may encode data to be transmitted over a communication link. In most embodiments, a decoder may decode data that has been received over a transmission link. In certain embodiments, an interleaver may change the order of data to be transmitted over a link. In many embodiments, a deinterleaver may reverse a change of order of data received over a link.

Often, a transmitter may use a modulation scheme for data to be transmitted using a signal to a receiver. Conventional modulation schemes associate data bits with symbols. Quadrature amplitude modulation (QAM) is one example type of a typical type of modulation scheme and is commonly used in many communication systems including fiber optical and digital radio communications. Generally, the number of different symbols in a modulation format determines the order of a digital communication scheme. Conventionally, higher order modulation formats enable carrying more bits of information or parity bits per symbol. Usually, by selecting a higher order format of QAM, the data rate of a link can be increased.

Conventionally, a QAM scheme may be associated with a constellation diagram having M points arranged in a two-dimensional plane. Usually, the M points represent the M possible symbols to which data bits may be mapped, where M is an integer. For example, an 8QAM scheme may be associated with a constellation diagram having 8 points arranged in a two-dimensional plane representing 8 possible symbols to which data bits may be mapped. As another example, in conventional 16QAM, data bits are mapped to 16 different symbols. Generally, each particular one of the M points may be associated with a label indicating the bit sequence mapped to the symbol represented by the particular one point. For example, a particular one of the 8 points in a constellation diagram for 8 QAM may be associated with a label (e.g., "010") indicating that data bits "010" are mapped to the symbol represented by the particular one point. Typically, in the presence of noise those 3 bits may exhibit different error probabilities, so they are in different reliability classes. Conventional examples of QAM schemes include 8QAM, 16QAM, 32QAM, 64QAM, and 256QAM schemes. Other conventional modulation schemes include BPSK and QPSK.

Typically, in communication systems, data transmitted over a link may be subjected to an environmental condition that may cause interference for a period of time and then cease to cause interference. Generally, the interference for a period of time may cause the data within that period of time to be corrupted so that the data may not be recovered using error checking information encoded in the data. Usually, if data is reordered, such that errors due to interference is spread out over a greater period of time, then the errors may be corrected. In a particular example, if an error occurring for 1 second over 10 seconds of transmitted data was changed to instead occur across the 10 seconds of data, then the amount of error per second of data transmitted can be reduced by a factor of 10. In most embodiments, use of an interleaver and deinterleaver may enable errors to be distributed across more data instead of being concentrated in the portion of time where the error occurred.

In certain embodiments, deinterleaving may be a process of restoring an order of transmission of bits from an demodulator when receiving the bits on the Horizontal and Vertical polarizations of optical channels, where the Horizontal and Vertical polarization may exhibit different signal to noise ratios and error rates, so bits transmitted over them are also in different reliability classes. In many embodiments, a deinterleaver may help insure bursts of errors do not cause decoding failures. In some embodiments, a deinterleaver may restore bits from H and V symbols appear that previously appeared equally in constituent codes. In certain embodiments, a deinterleaver may reverse the changes made by an interleaver to insure that bits in each reliability class (in higher order modulations) are balanced in constituent codes. In many embodiments, a deinterleaver may reverse changes made by an interleaver to insure that bits with correlated errors (in non-Gray mapped constellations) appear in different constituent codes.

In many embodiments, a deinterleaver buffer may refer to a set of metrics that the deinterleaver deinterleaves or changes the order of in a given period of time. In certain embodiments, a bit metric may be a representation of a demodulator decision about a bit being correct and probability of the reliability of that decision. In most embodiments, a bit metric may be referred to interchangeable herein as a metric. In many embodiments, a bit metric may be transformed into a bit by one or more of the techniques described herein. In certain embodiments, an deinterleaver may change a bit metric into a bit. In other embodiments, a decoder may change a bit metric into a bit. In some embodiments, which may be referred to herein as hard decoding, a metric itself may consist of a single bit, indicating if the received bit was a 0 or 1. In other embodiments, a metric may consist of several bits. In a particular embodiment, a deinterleaver buffer size may be 172,032 metrics. In some embodiments, 172,032 metrics may be organized as an (84, 8) array of 16×16 metric blocks. In certain embodiments, an intra-block deinterleaver may reorder metrics in 16×16 blocks to undo changes by an interleaver that insured that the bits in each row and column of a block of an encoder output are remapped almost uniformly in a block for transmission on the line. In many embodiments, an inter-block deinterleaver may reverse changes in order by an interleaver that caused nearby symbols on a line to contain bits that are widely separated in an encoder output.

In certain embodiments, an inverse of an intra-block permutation applied by a deinterleaver may be applied to blocks in a buffer before the blocks are read by one or more decoders. In some embodiments, a buffer may be partitioned in an upper half of 42 rows and a bottom part of 42 block rows. In many embodiments, a buffer may be partitioned into 4 subsets, each containing 21×8 blocks or 336×128 bits. In certain embodiments, a first subset may contain row blocks 0, 2, . . . , 40. In those certain embodiments, a second subset may contain row blocks 1, 3, . . . , 41. In those certain embodiments, a third subset may contain row blocks 42, 44, . . . , 82. In those certain embodiments, a fourth subset may contain row blocks 43, 45, . . . , 83.

In certain embodiments, on output, groups of 8 metrics may be written in turn to each subset, writing them in a column of bits before proceeding to the next columns of bits. In some embodiments, a first 8 metrics may be written from the top of a first column (i.e. column 0) of a first subset, then a first 8 metrics from a first column of a second, third, and forth subset. In many embodiments, the first 8 metrics from four subsets may be followed by writing a next 8 metrics in the first column of a first, second, third, and fourth subsets. In many embodiments, after 42 cycles of writing 4×8 bits each, a first bit column of an interleaver buffer may be completely written in, and an output process may continue by writing bit columns 1 to 127. In most embodiments, writing by columns of bits may be superior to writing by rows. In some embodiments, interleaver columns may be much longer than rows, and thus bits in a column may be spread over more constituent codes than bits in a row. In certain embodiments, writing columns when columns are longer than rows may increase a tolerance to long bursts or errors. Thus, in most embodiments, a deinterleaver may perform the inverse of what an interleaver did to create a buffer on a transmit side.

In some embodiments, intra-block deinterleaving may be specified by a table, which may indicate for each metric in the block received to what a row and column the corresponding source bit belonged before being intra-block interleaved, and thus to what row and column the metric should be deinterleaved. In a particular embodiment, for example, a table may specify that the bit corresponding to metric (14, 15) of an deinterleaver input block (i.e. output in a buffer as written by a demodulator before such output is read by one or more decoders) was placed by an interleaver in row 1 (base 0) of column 0 and the corresponding metric should be deinterleaved to (14,15).

In some embodiments, a deinterleaver may assume that symbol bits in each reliability class in each constituent code word have been balanced. In certain embodiments, each row and each column may have been mapped uniformly on all possible positions by an interleaver. In some embodiments, an even mapping may imply that each constituent codeword is mapped uniformly to H and V symbols, and that for 16 QAM bits in each constituent codeword are mapped uniformly to reliability classes of symbol bits. In most embodiments, a symbol bit may refer to the bit label or bits associated with a particular point or symbol in a constellation.

In certain embodiments, there may be a mean, minimum and maximum numbers of occurrences of a bits in each reliability class in a constituent code for modulations of interest. In some embodiments, an ideal balance may be when a minimum and maximum are equal to a mean. In certain embodiments, a constituent codeword may have 256 bits. In some embodiments, for QPSK, the mean, max, and min may be 64. In many embodiments, for 8QAM, the mean may be 42.66, the min may be 37, and the max may be 46. In other embodiments, for 16-QAM, the mean, max, and min may be 32.

In some embodiments, deviations from the mean may be close to a standard deviation produced by a random interleaver. In particular embodiments, a worst case may not be far from a mean and no significant differences in decoder performance may be observed compared to a random interleavers. In certain embodiments, spatial coupling between intersecting constituent codes may contribute to the averaging process during iterative decoding.

In some embodiments, a full rate deinterleaver may feed two half data rate decoders, 0 and 1. In some embodiments, successive rows of even rows blocks may be read from a buffer and written to a first decoder 0. In many embodiments, successive odd block rows of blocks may be read from a buffer and used to feed a second decoder. In certain embodiments, a content of a deinterleaver buffer may read out row by row deinterleaving vertical segments of the buffer with alternative rows feeding different encoders, for example Product Code decoders. In some embodiments, a matrix of a decoder fed by a deinterleaver may be considered infinite as the data being deinterleaved by the deinterleaver may not have a defined end point as data may continue to be demodulatored by a demodulator.

Refer now to the example embodiment of FIG. 1a. FIG. 1a is a simplified example embodiment of an optical system with a link and two transceivers, each transceiver with an encoder, decoder, mapper modulator, decoder, demapper, and demodulator. In FIG. 1a, optical transceiver 115 has encoder 120, interleaver 130 and mapper/modulator 135. As well, transceiver 115 has demapper/demodulator 178, deinterleaver 180, and decoder 181. In the example embodiment of FIG. 1a, each functionality is shown as a separate box, however in alternative embodiments functionality may be combined or shared depending on design.

Referring back to the example embodiment of FIG. 1a, encoder 120 receives input signal 110 (step 180). Encoder 120 encodes input signal 110 to generate a plurality of bits 126 (step 182). Interleaver 130 interleaves the bits (step 183). Mapper/Modulator 135 modulates light to send the plurality of signals across link 140 to transceiver 145 (step 186).

Transceiver 145 has demapper/demodulator 155, interleaver 157, and decoder 260. Demapper/demodulator 155 receives the symbols from optical link 140 (step 190). Demapper/demodulator 155 associates the received symbols with a plurality of bits (step 192) and assign to each bit a metric that indicates the probability that the transmitted bit was a 0 or a 1. Refer back to the example embodiment of FIG. 1a, demapper/demodulator 155 provides the plurality of metrics to deinterleaver 157 (step 193). Deinterleaver 157 deinterleaves the data (step 194). Decoder 160 decodes the metrics (step 196). Transceiver 145 also has encoder 170, interleaver 172 and mapper/modulator 174. Encoder 170, interleaver 172, and mapper modulator 175 act in a similar manner to encoder 120, interleaver 130, and mapper/modulator 135 at Transceiver 115. Similarly, decoder 181, deinterleaver 180 and demodulator/demapper 178 of Transceiver 115 function similarly to demapper/demodulatore 155, interleaver 157, and decoder 160 of transceiver 145.

In the illustrative embodiment of FIG. 1a, modulator 135 is able to transmit the plurality of symbols optical link 240 by modulating the plurality of symbols onto a carrier light wave with 2 polarizations, which propagates over optical communications link 140. In the illustrative embodiment of FIG. 1a, mapper/modulator 135 may be enabled to associate the plurality of bits 110 with symbols 124 according to a QAM format.

In certain embodiments, an encoder such as encoder 120 of FIG. 1a, may generate a plurality of bits from an input signal using a turbo product code (TPC). In some embodiments, an encoder such as encoder 120 of FIG. 1a, may generate a plurality of bits from an input signal using a convolutional low-density parity check code (LDPC). In further embodiments, an encoder such as encoder 120 of FIG. 1a, may generate a plurality of bits from an input signal using any suitable forward error correction code. In many embodiments, a plurality of bits may include parity bits generated by an encoder. In certain embodiments, an encoder may be implemented in hardware as circuitry. In some embodiments, an encoder may be implemented as part of an application-specific integrated circuit (ASIC).

Figure 2:
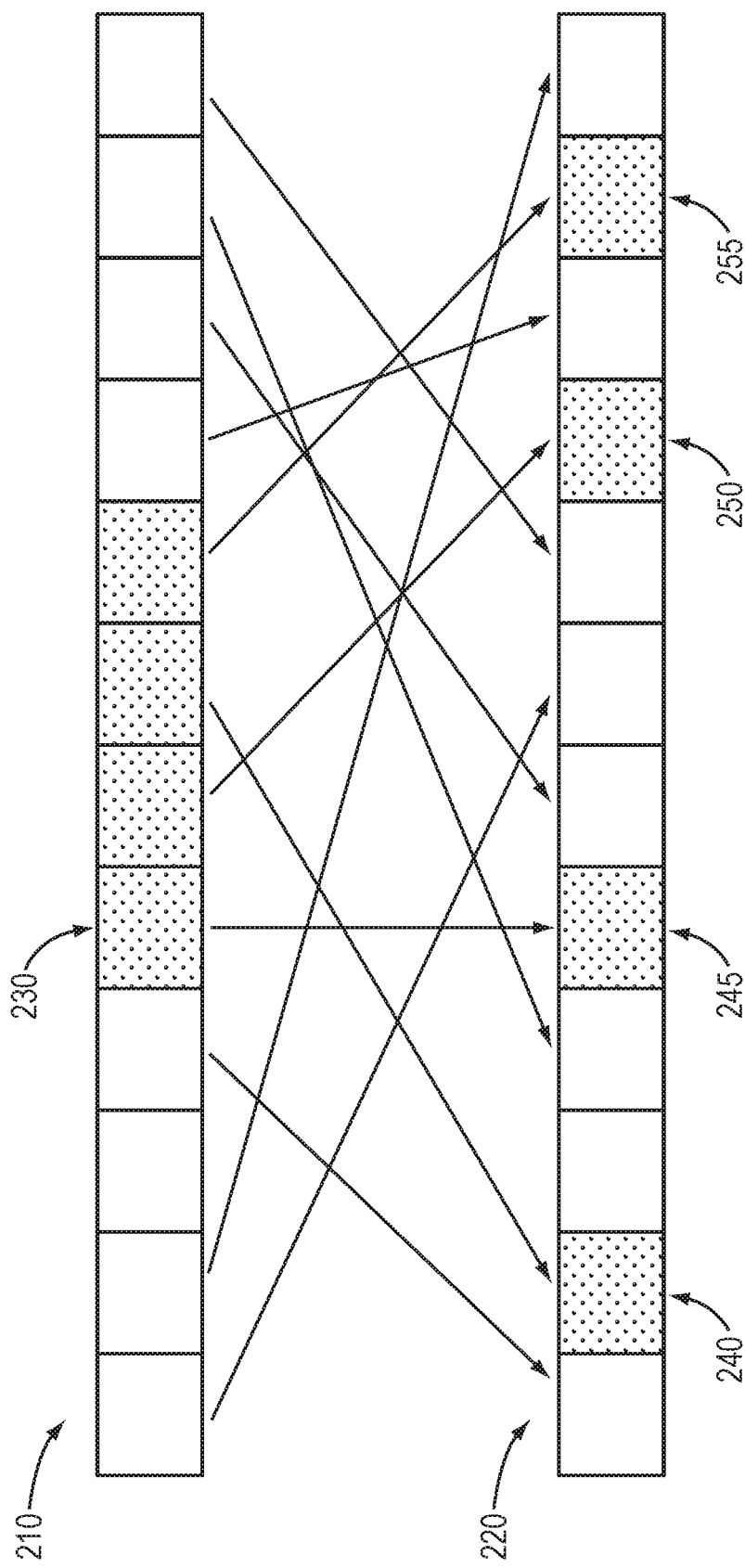
FIG. 2 is a simplified illustration of spreading out an error burst, in accordance with an embodiment of the present disclosure.

Refer now to the example embodiment of FIG. 2, which illustrates a burst error with interleaved data. Data transmission 210 represents has been exposed to burst error 230. In FIG. 2, data mapping 220 represents the deinterleaved data of data transmission 210. In FIG. 2, bust error 230 has, through a deinterleaving process, been spread out to be errors 240, 245, 250, and 255. In most embodiments, spreading out a burst error across more data may enable better error recovery from the burst error.

Refer now to the example embodiment of FIG. 3, which shows a table a mean, minimum, and maximum of occurrences of a bits in each reliability class in a constituent code for sample modulations. In the table of FIG. 3, for QPSK, the mean, max, and min are 64. In the table of FIG. 3, for 8QAM, the mean is 42.66, the min is 37, and the max is 46. In the table of FIG. 3, for 16-QAM, the mean, max, and min are 32.

Figure 4:
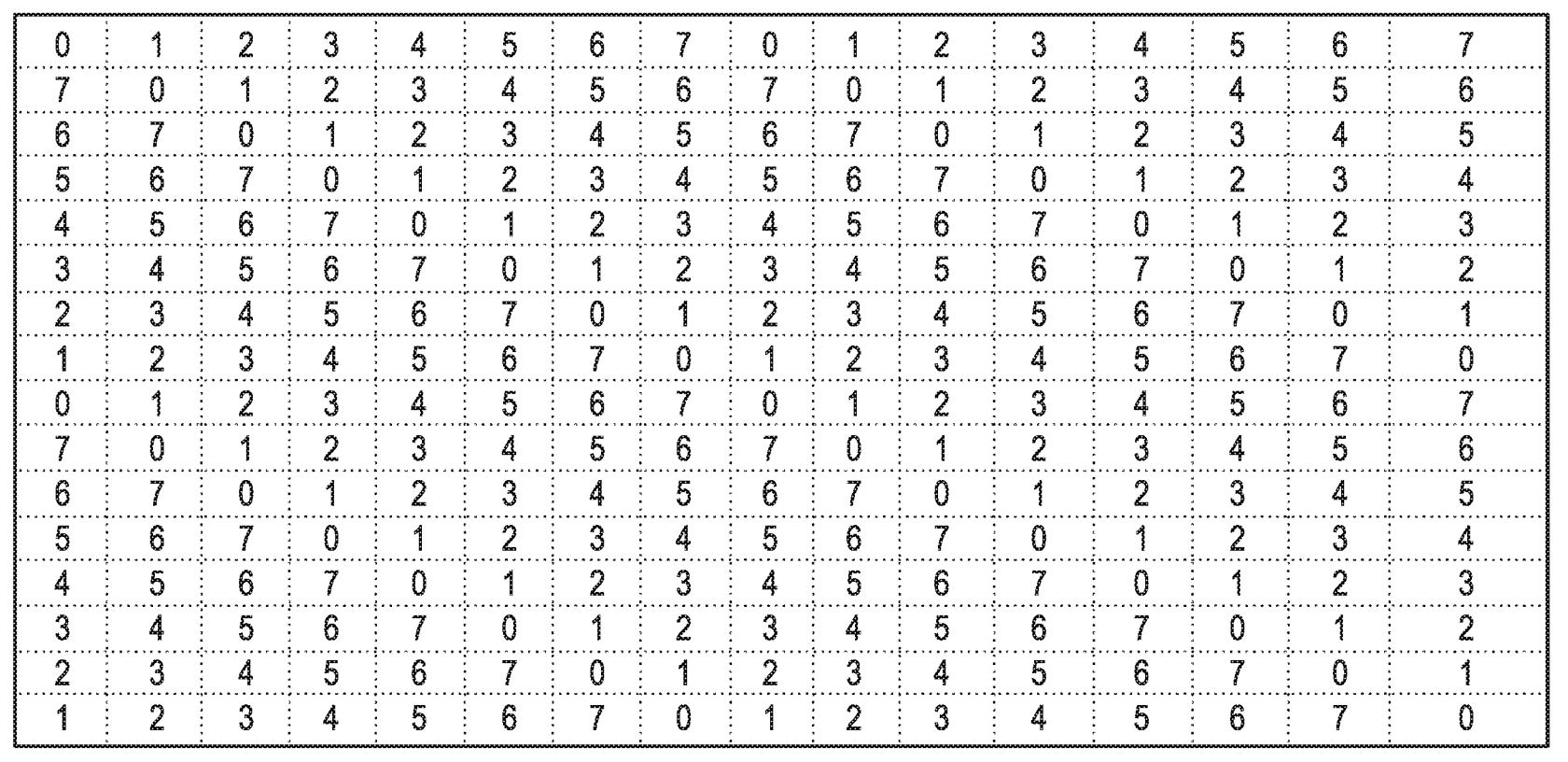

Refer now to the example embodiment of FIG. 4, which illustrates balancing symbol bits in each reliability class in each constituent codeword for 16 QAM. The table of FIG. 4 shows to which bit in a group of 8, each coded bit (before intra-block permutation) is mapped. Each row and each column is mapped uniformly on all possible positions. In this embodiment, this means that each constituent codeword is mapped uniformly to H and V symbols, and that for 16 QAM the bits in each constituent codeword are mapped uniformly to all reliability classes of symbol bits.

Figure 5:
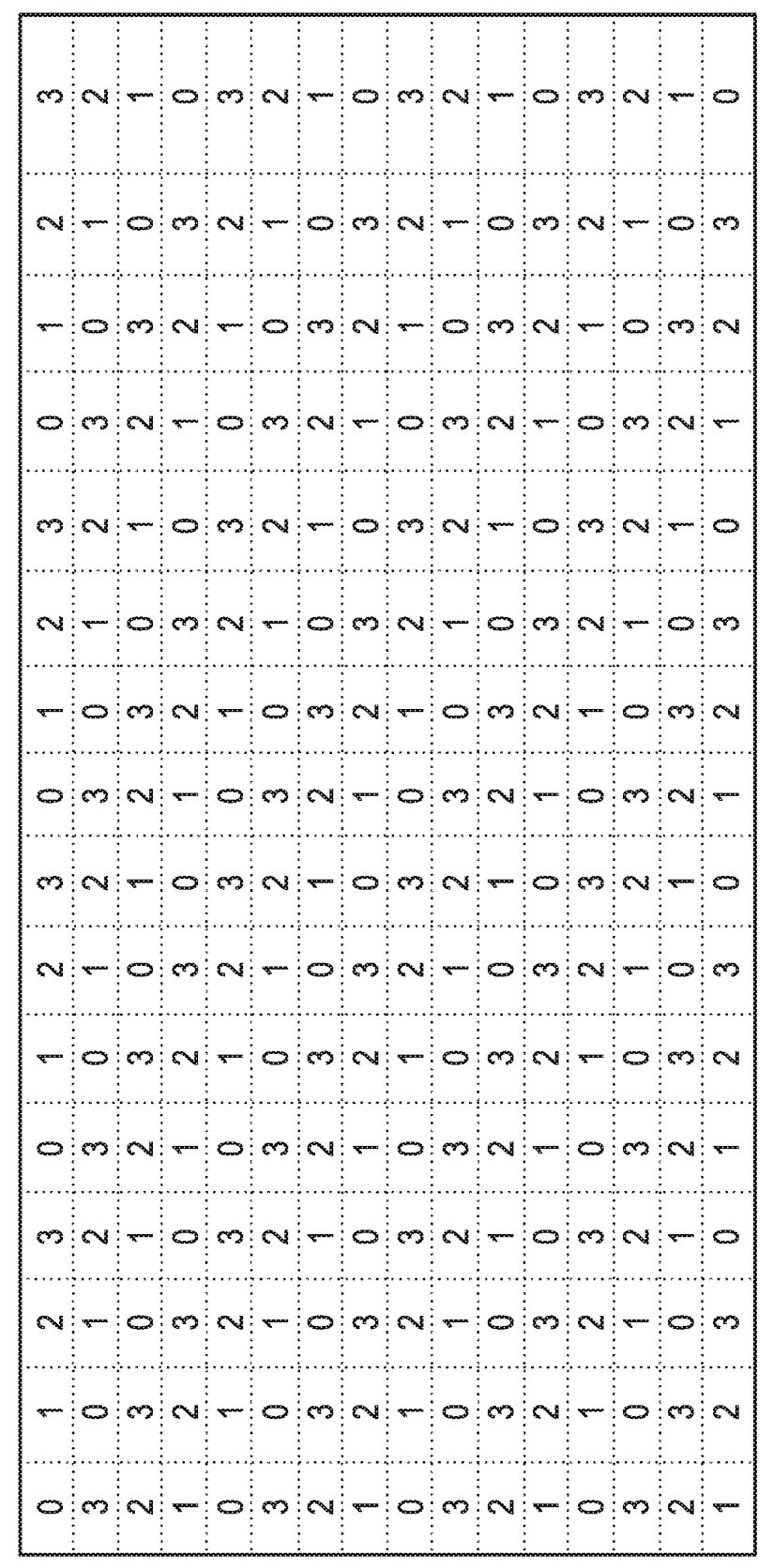

Refer now to the example embodiment of FIG. 5, which illustrates balancing symbol bits in each reliability class in each constituent codeword for QPSK. In this example embodiment, such a table is possible as the indices of transmission of the bits on the line, taken modulo, where N is twice the number of bits per symbol S, are the same in each block. The table of FIG. 5 shows to which of the 4 reliability classes, each coded bit (before intra-block permutation) is mapped. In this embodiment, each row and each column is mapped uniformly.

In most embodiments, such as for example in FIGS. 5 and 6, a table for balancing symbol bits in each reliability class in each constituent codeword may be possible when the indices of transmission of the bits on the line, taken modulo N, where N is twice the number of bits per symbol, are the same in each block.

Refer now to the example embodiment of FIG. 6, which illustrates partitioning a buffer of a deinterleaver. In the example embodiment of FIG. 6, a buffer is divided into a top portion of 42 rows and a bottom portion of 42 rows. The top portion is represented as 2 subsets 0 and 1. The lower portion is represented as two subsets 2 and 3. Overall, in this embodiment, the buffer is divided into 4 parts, 0, 1, 2, and 3, by row blocks. For example, the first partition contains rows blocks 0, 2, . . . , 40 and the second partition contains row blocks 1, 3, . . . , 41. The third partition contains row blocks 42, 44, . . . , 82 and the fourth partition contains row blocks 43, 45, . . . 83. Each of the four subsets contains 21 by 8 blocks or 336 by 128 bits.

Figure 1C:
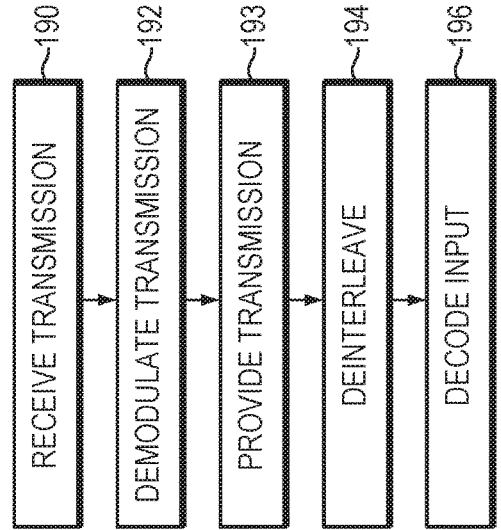
FIG. 1c is a simplified method for receiving information in a communication system, in accordance with an embodiment of the present disclosure.
Figure 1B:
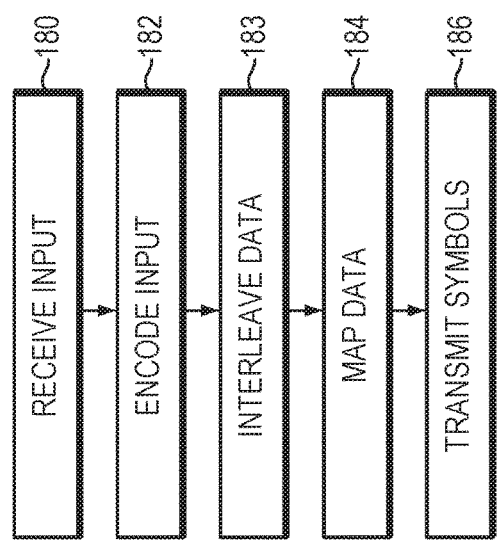
FIG. 1b is a simplified method for transmitting information in a communication system, in accordance with an embodiment of the present disclosure.
Figure 7:
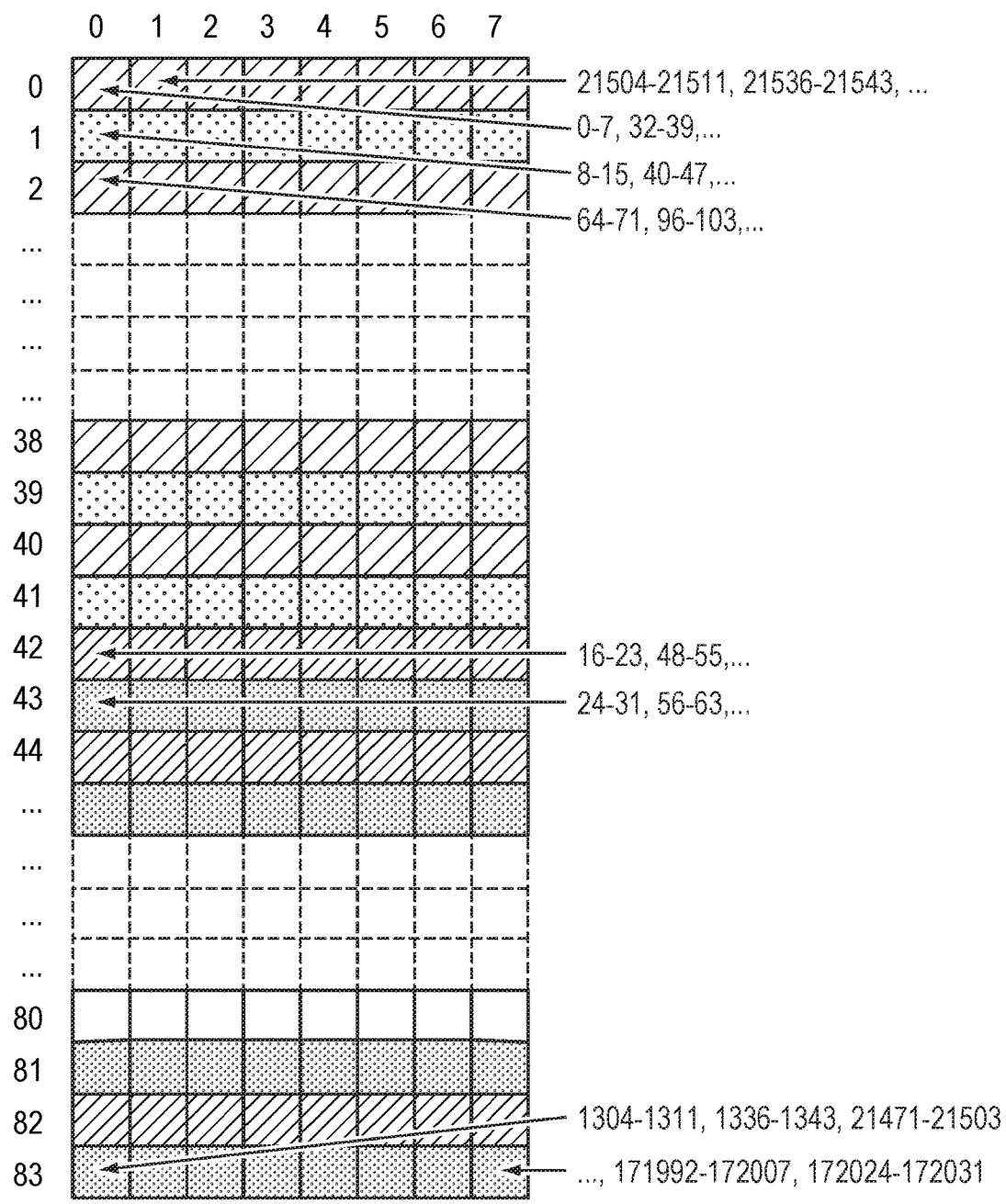
FIG. 7 is a simplified illustration of a mapping showing a write sequence for a buffer, in accordance with an embodiment of the present disclosure.

Refer now to the example embodiment of FIG. 7, which illustrates writing rows into a buffer from data received from a demodulator. In the example embodiment of FIG. 7, groups of 8 bits are written in turn from each subset, writing them into a column of bits before proceeding to the next columns of bits. For example, as shown in FIG. 1, the first 8 bits are written to the top of first column of subset 0, then the first 8 bits from the first column of subsets 1, 2 and 3. Those 32 bits are then followed by the taking the next 8 bits in the first column of each of the subsets 0, 1, 2 and 3. After 42 such cycles of 4×8 bits each, the first bit column of the deinterleaver buffer will be completely written, and the output process continues by reading bit columns 1 to 127.

Refer now to the example embodiment of FIG. 8, which illustrates a mapping table for intra-block deinterleaving. The example embodiment of FIG. 8 is 16 by 16 table 300, that indicates the row and column of each destination bit for each source bit in the block. In FIG. 8, entry (14,15) 310 in row 1 (base 0) of column 0 indicates that the metric in row 1 of column 0 should be placed in row 14 column 15 of the block written to the decoder. In most embodiments, intra-block interleaving may be performed on a deinterleaver buffer that is mapped into arrays of 16 by 16 bits. In certain embodiments herein, the mapping of FIG. 8 may be applied to each block in a buffer filled in by an demodulator.

Figure 9:
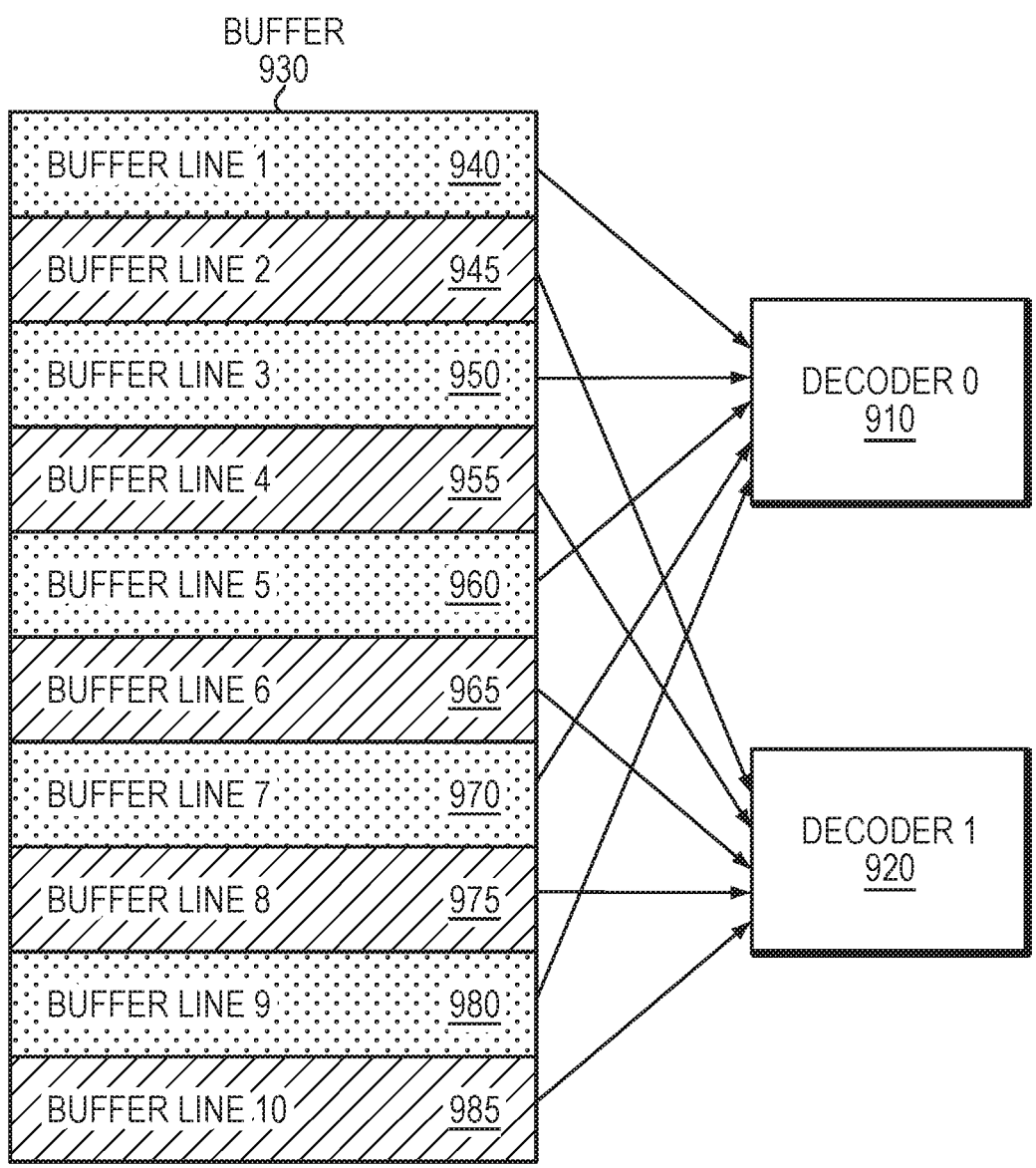
FIG. 9 is a simplified illustration of decoders reading from a buffer, in accordance with an embodiment of the present disclosure.

Refer now to the example embodiment of FIG. 9, that illustrates two half decoders. In the example embodiment of FIG. 9 decoders 0 910 and encoder 1 920 read from buffer 930. Decoder 0 910 and decoders 1 920 alternate reading lines in from buffer 930. In this example embodiment, decoders 0 910 reads alternative lines in buffer 930 such as buffer line 1 940, buffer line 3 950, buffer line 5 960, buffer line 7 970 and buffer line 9 980. In this example embodiment, encoder 1 930 feeds alternative lines in buffer 930 such as buffer line 2 945, buffer line 4 955, buffer line 6 965, buffer line 8 976 and buffer line 10 985. Each row block contains eight 16×16 blocks.

Figure 10:
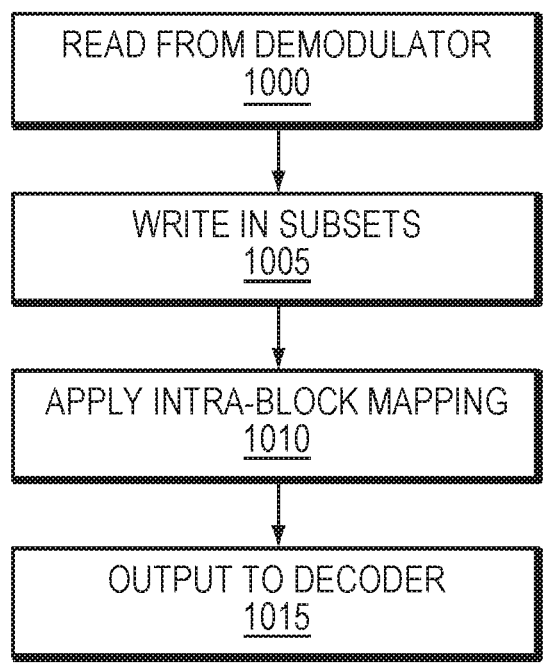
FIG. 10 is a simplified method for deinterleaving, in accordance with an embodiment of the present disclosure.
Figure 11:
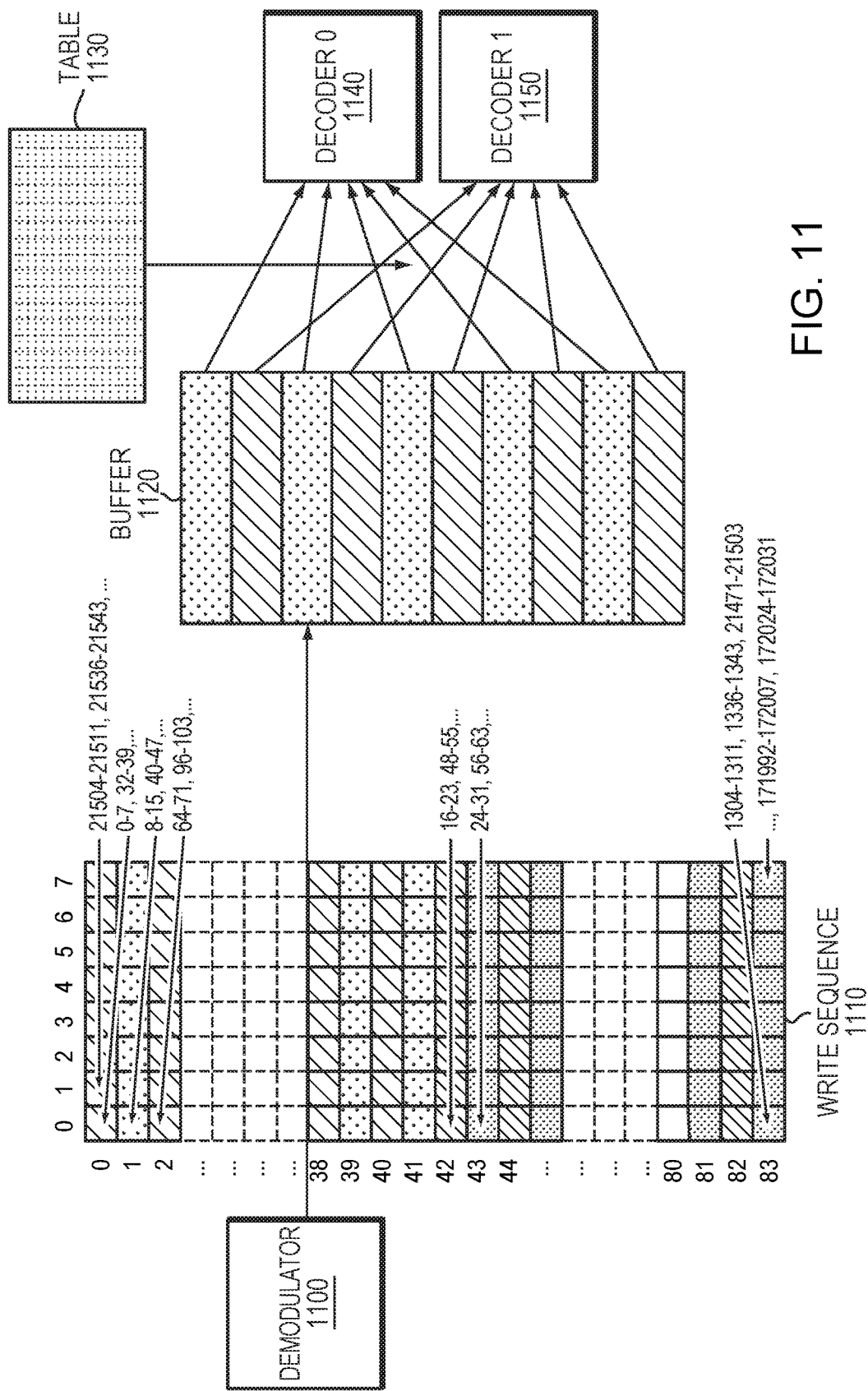
FIG. 11 is a simplified illustration of a deinterleaving system, in accordance with an embodiment of the present disclosure.

Refer now to the example embodiments of FIGS. 10 and 11, which illustrate a sample interleaving process. Data is received from demodulator 1110 (step 1000). Data is written from according to write sequence 1110 in buffer 1120 (step 1005). Intra block demapping from table 1130 is applied to the data (step 1010) and the data is sent in alternating rows to decoder 0 1140 and decoder 1 1150 (Step 1015).

In a particular embodiments, for step 1005, a first 8 bits metrics is written from the top of a first column (i.e. column 0) of a first subset, then a first 8 bits metrics from the top of a first column of a second, third, and forth subset. In these particular embodiments, the first 8 bits metrics from four subsets is followed by taking writing a next 8 bits metrics in the first column of a first, second, third, and fourth subsets. In these particular embodiments, after 42 cycles of writing 4×8 bits metrics each, a first bit metric column of a deinterleaver buffer are be completely written out in, and an output process may continue by writing bit metric columns 1 to 127.

In some particular embodiments, for step 1010, "intra-block deinterleaving is specified by a table, such as the table of" FIG. 8, which indicates for each metric in the block received to what a row and column the corresponding source bit belonged before being intra-block interleaved, and thus to what row and column the metric is deinterleaved. In these some particular embodiments, as specified FIG. 8, for example, the bit corresponding to metric (14, 15) of an deinterleaver input block (i.e. output in a buffer as written by a demodulator before such output is read by one or more decoders) was written in row 1 (base 0) of column 0 and the corresponding metric should be deinterleaved to (14,15).

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. A method for deinterleaving data comprising:
    writing data into a buffer having 172,032 metrics arranged into an 84 by 8 array of 16 by 16 blocks; wherein the buffer is partitioned into 4 subsets of rows according to a predetermined write sequence;
    applying a mapping table to change data in each of the 16 by 16 block of arrays according to a table; wherein the table specifies a mapping of the location for each metric in the 16 by 16 block; and
    reading the data out of the buffer to serve as input for a first decoder and a second decoder.

2. The method of claim 1 where the first elements of the 16 by 16 table entries form a Latin square.

3. The method of claim 1 wherein the method is for deinterleaving data encoded using a 16 QAM modulation.

4. The method of claim 3 wherein symbol bits in each reliability class are balanced in each constituent codeword.

5. The method of claim 4 wherein the indices of transmission of the metrics on the line, taken modulo N, where N is twice the number of metrics per symbol, are the same in each block.

6. The method of claim 1 wherein the table is:

| 0,0 | 1,1 | 2,2 | 3,3 | 4,4 | 5,5 | 6,6 | 7,7 | 8,8 | 9,9 | 10,10 | 11,11 | 12,12 | 13,13 | 14,14 | 15,15 |
|---|---|---|---|---|---|---|---|---|---|---|---|---|---|---|---|
| 14,15 | 15,0 | 0,1 | 1,2 | 2,3 | 3,4 | 4,5 | 5,6 | 6,7 | 7,8 | 8,9 | 9,10 | 10,11 | 11,12 | 12,13 | 13,14 |
| 12,14 | 13,15 | 14,0 | 15,1 | 0,2 | 1,3 | 2,4 | 3,5 | 4,6 | 5,7 | 6,8 | 7,9 | 8,10 | 9,11 | 10,12 | 11,13 |
| 10,13 | 11,14 | 12,15 | 13,0 | 14,1 | 15,2 | 0,3 | 1,4 | 2,5 | 3,6 | 4,7 | 5,8 | 6,9 | 7,10 | 8,11 | 9,12 |
| 8,12 | 9,13 | 10,14 | 11,15 | 12,0 | 13,1 | 14,2 | 15,3 | 0,4 | 1,5 | 2,6 | 3,7 | 4,8 | 5,9 | 6,10 | 7,11 |
| 6,11 | 7,12 | 8,13 | 9,14 | 10,15 | 11,0 | 12,1 | 13,2 | 14,3 | 15,4 | 0,5 | 1,6 | 2,7 | 3,8 | 4,9 | 5,10 |
| 4,10 | 5,11 | 6,12 | 7,13 | 8,14 | 9,15 | 10,0 | 11,1 | 12,2 | 13,3 | 14,4 | 15,5 | 0,6 | 1,7 | 2,8 | 3,9 |
| 2,9 | 3,10 | 4,11 | 5,12 | 6,13 | 7,14 | 8,15 | 9,0 | 10,1 | 11,2 | 12,3 | 13,4 | 14,5 | 15,6 | 0,7 | 1,8 |
| 15,7 | 0,8 | 1,9 | 2,10 | 3,11 | 4,12 | 5,13 | 6,14 | 7,15 | 8,0 | 9,1 | 10,2 | 11,3 | 12,4 | 13,5 | 14,6 |
| 13,6 | 14,7 | 15,8 | 0,9 | 1,10 | 2,11 | 3,12 | 4,13 | 5,14 | 6,15 | 7,0 | 8,1 | 9,2 | 10,3 | 11,4 | 12,5 |
| 11,5 | 12,6 | 13,7 | 14,8 | 15,9 | 0,10 | 1,11 | 2,12 | 3,13 | 4,14 | 5,15 | 6,0 | 7,1 | 8,2 | 9,3 | 10,4 |
| 9,4 | 10,5 | 11,6 | 12,7 | 13,8 | 14,9 | 15,10 | 0,11 | 1,12 | 2,13 | 3,14 | 4,15 | 5,0 | 6,1 | 7,2 | 8,3 |
| 7,3 | 8,4 | 9,5 | 10,6 | 11,7 | 12,8 | 13,9 | 14,10 | 15,11 | 0,12 | 1,13 | 2,14 | 3,15 | 4,0 | 5,1 | 6,2 |
| 5,2 | 6,3 | 7,4 | 8,5 | 9,6 | 10,7 | 11,8 | 12,9 | 13,10 | 14,11 | 15,12 | 0,13 | 1,14 | 2,15 | 3,0 | 4,1 |
| 3,1 | 4,2 | 5,3 | 6,4 | 7,5 | 8,6 | 9,7 | 10,8 | 11,9 | 12,10 | 13,11 | 14,12 | 15,13 | 0,14 | 1,15 | 2,0 |
| 1,0 | 2,1 | 3,2 | 4,3 | 5,4 | 6,5 | 7,6 | 8,7 | 9,8 | 10,9 | 11,10 | 12,11 | 13,12 | 14,13 | 15,14 | 0,15 |

7. The method of claim 1 wherein the method is for deinterleaving data encoded using QPSK modulation.

8. An apparatus comprising:
    a deinterleaver; the deinterleaver containing logic enabling:
    writing into a buffer having 172,032 metrics arranged into an 84 by 8 array of 16 by 16 blocks; wherein the buffer is partitioned into 4 subsets of rows; by writing data into the buffer in groups of 8 metrics; wherein each of the groups of 8 metrics are written in turn to each subset, in a column by column ordering; and
    rearranging data in each 16 by 16 block of arrays according to a table; wherein the table specifies the rearranged location of each metric in the 16 by 16 block.

9. The apparatus of claim 8 where the first elements of the 16 by 16 table entries form a Latin square.

10. The apparatus of claim 8 wherein a data modulation format for the data is for a 16 QAM modulation.

11. The apparatus of claim 10 wherein symbol bits in each reliability class are balanced in each constituent codeword.

12. The apparatus of claim 11 wherein the indices of transmission of the metrics on the line, taken modulo N, where N is twice the number of metrics per symbol, are the same in each block.

13. The apparatus of claim 8 wherein the table is:

| 0,0 | 1,1 | 2,2 | 3,3 | 4,4 | 5,5 | 6,6 | 7,7 | 8,8 | 9,9 | 10,10 | 11,11 | 12,12 | 13,13 | 14,14 | 15,15 |
|---|---|---|---|---|---|---|---|---|---|---|---|---|---|---|---|
| 14,15 | 15,0 | 0,1 | 1,2 | 2,3 | 3,4 | 4,5 | 5,6 | 6,7 | 7,8 | 8,9 | 9,10 | 10,11 | 11,12 | 12,13 | 13,14 |
| 12,14 | 13,15 | 14,0 | 15,1 | 0,2 | 1,3 | 2,4 | 3,5 | 4,6 | 5,7 | 6,8 | 7,9 | 8,10 | 9,11 | 10,12 | 11,13 |
| 10,13 | 11,14 | 12,15 | 13,0 | 14,1 | 15,2 | 0,3 | 1,4 | 2,5 | 3,6 | 4,7 | 5,8 | 6,9 | 7,10 | 8,11 | 9,12 |
| 8,12 | 9,13 | 10,14 | 11,15 | 12,0 | 13,1 | 14,2 | 15,3 | 0,4 | 1,5 | 2,6 | 3,7 | 4,8 | 5,9 | 6,10 | 7,11 |
| 6,11 | 7,12 | 8,13 | 9,14 | 10,15 | 11,0 | 12,1 | 13,2 | 14,3 | 15,4 | 0,5 | 1,6 | 2,7 | 3,8 | 4,9 | 5,10 |
| 4,10 | 5,11 | 6,12 | 7,13 | 8,14 | 9,15 | 10,0 | 11,1 | 12,2 | 13,3 | 14,4 | 15,5 | 0,6 | 1,7 | 2,8 | 3,9 |
| 2,9 | 3,10 | 4,11 | 5,12 | 6,13 | 7,14 | 8,15 | 9,0 | 10,1 | 11,2 | 12,3 | 13,4 | 14,5 | 15,6 | 0,7 | 1,8 |
| 15,7 | 0,8 | 1,9 | 2,10 | 3,11 | 4,12 | 5,13 | 6,14 | 7,15 | 8,0 | 9,1 | 10,2 | 11,3 | 12,4 | 13,5 | 14,6 |
| 13,6 | 14,7 | 15,8 | 0,9 | 1,10 | 2,11 | 3,12 | 4,13 | 5,14 | 6,15 | 7,0 | 8,1 | 9,2 | 10,3 | 11,4 | 12,5 |
| 11,5 | 12,6 | 13,7 | 14,8 | 15,9 | 0,10 | 1,11 | 2,12 | 3,13 | 4,14 | 5,15 | 6,0 | 7,1 | 8,2 | 9,3 | 10,4 |
| 9,4 | 10,5 | 11,6 | 12,7 | 13,8 | 14,9 | 15,10 | 0,11 | 1,12 | 2,13 | 3,14 | 4,15 | 5,0 | 6,1 | 7,2 | 8,3 |
| 7,3 | 8,4 | 9,5 | 10,6 | 11,7 | 12,8 | 13,9 | 14,10 | 15,11 | 0,12 | 1,13 | 2,14 | 3,15 | 4,0 | 5,1 | 6,2 |
| 5,2 | 6,3 | 7,4 | 8,5 | 9,6 | 10,7 | 11,8 | 12,9 | 13,10 | 14,11 | 15,12 | 0,13 | 1,14 | 2,15 | 3,0 | 4,1 |
| 3,1 | 4,2 | 5,3 | 6,4 | 7,5 | 8,6 | 9,7 | 10,8 | 11,9 | 12,10 | 13,11 | 14,12 | 15,13 | 0,14 | 1,15 | 2,0 |
| 1,0 | 2,1 | 3,2 | 4,3 | 5,4 | 6,5 | 7,6 | 8,7 | 9,8 | 10,9 | 11,10 | 12,11 | 13,12 | 14,13 | 15,14 | 0,15 |

14. The apparatus of claim 8 wherein a data modulation format for the data is for a QPSK modulation.

15. A system comprising:
one or more decoders;
a deinterleaver; the deinterleaver containing logic enabling:
writing data into a buffer having 172,032 metrics arranged into an 84 by 8 array of 16 by 16 blocks; wherein the buffer is partitioned into 4 subsets of rows according to a predetermined write sequence;
applying a mapping table to change data in each of the 16 by 16 block of arrays according to a table; wherein the table specifies a mapping of the location for each metric in the 16 by 16 block; and
reading the data out of the buffer to serve as input for a first decoder and a second decoder.

16. The system of claim 15 wherein the one or more decoder read data from the buffer; wherein the one or more decoders switch between reading data from the buffer.

17. The system of claim 15 where the first elements of the 16 by 16 table entries form a Latin square.

18. The apparatus of claim 15 wherein a data modulation format for the data is for a 16 QAM modulation.

19. The apparatus of claim 15 wherein the table is:

| 0,0 | 1,1 | 2,2 | 3,3 | 4,4 | 5,5 | 6,6 | 7,7 | 8,8 | 9,9 | 10,10 | 11,11 | 12,12 | 13,13 | 14,14 | 15,15 |
|---|---|---|---|---|---|---|---|---|---|---|---|---|---|---|---|
| 14,15 | 15,0 | 0,1 | 1,2 | 2,3 | 3,4 | 4,5 | 5,6 | 6,7 | 7,8 | 8,9 | 9,10 | 10,11 | 11,12 | 12,13 | 13,14 |
| 12,14 | 13,15 | 14,0 | 15,1 | 0,2 | 1,3 | 2,4 | 3,5 | 4,6 | 5,7 | 6,8 | 7,9 | 8,10 | 9,11 | 10,12 | 11,13 |
| 10,13 | 11,14 | 12,15 | 13,0 | 14,1 | 15,2 | 0,3 | 1,4 | 2,5 | 3,6 | 4,7 | 5,8 | 6,9 | 7,10 | 8,11 | 9,12 |
| 8,12 | 9,13 | 10,14 | 11,15 | 12,0 | 13,1 | 14,2 | 15,3 | 0,4 | 1,5 | 2,6 | 3,7 | 4,8 | 5,9 | 6,10 | 7,11 |
| 6,11 | 7,12 | 8,13 | 9,14 | 10,15 | 11,0 | 12,1 | 13,2 | 14,3 | 15,4 | 0,5 | 1,6 | 2,7 | 3,8 | 4,9 | 5,10 |
| 4,10 | 5,11 | 6,12 | 7,13 | 8,14 | 9,15 | 10,0 | 11,1 | 12,2 | 13,3 | 14,4 | 15,5 | 0,6 | 1,7 | 2,8 | 3,9 |
| 2,9 | 3,10 | 4,11 | 5,12 | 6,13 | 7,14 | 8,15 | 9,0 | 10,1 | 11,2 | 12,3 | 13,4 | 14,5 | 15,6 | 0,7 | 1,8 |
| 15,7 | 0,8 | 1,9 | 2,10 | 3,11 | 4,12 | 5,13 | 6,14 | 7,15 | 8,0 | 9,1 | 10,2 | 11,3 | 12,4 | 13,5 | 14,6 |
| 13,6 | 14,7 | 15,8 | 0,9 | 1,10 | 2,11 | 3,12 | 4,13 | 5,14 | 6,15 | 7,0 | 8,1 | 9,2 | 10,3 | 11,4 | 12,5 |
| 11,5 | 12,6 | 13,7 | 14,8 | 15,9 | 0,10 | 1,11 | 2,12 | 3,13 | 4,14 | 5,15 | 6,0 | 7,1 | 8,2 | 9,3 | 10,4 |
| 9,4 | 10,5 | 11,6 | 12,7 | 13,8 | 14,9 | 15,10 | 0,11 | 1,12 | 2,13 | 3,14 | 4,15 | 5,0 | 6,1 | 7,2 | 8,3 |
| 7,3 | 8,4 | 9,5 | 10,6 | 11,7 | 12,8 | 13,9 | 14,10 | 15,11 | 0,12 | 1,13 | 2,14 | 3,15 | 4,0 | 5,1 | 6,2 |
| 5,2 | 6,3 | 7,4 | 8,5 | 9,6 | 10,7 | 11,8 | 12,9 | 13,10 | 14,11 | 15,12 | 0,13 | 1,14 | 2,15 | 3,0 | 4,1 |
| 3,1 | 4,2 | 5,3 | 6,4 | 7,5 | 8,6 | 9,7 | 10,8 | 11,9 | 12,10 | 13,11 | 14,12 | 15,13 | 0,14 | 1,15 | 2,0 |
| 1,0 | 2,1 | 3,2 | 4,3 | 5,4 | 6,5 | 7,6 | 8,7 | 9,8 | 10,9 | 11,10 | 12,11 | 13,12 | 14,13 | 15,14 | 0,15 |

20. The apparatus of claim 15 wherein a data modulation format for the data is for a QPSK modulation.

* * * * *